(12) United States Patent
Mueller et al.

(10) Patent No.: US 6,509,735 B2
(45) Date of Patent: Jan. 21, 2003

(54) METHOD FOR OPERATING A MAGNETIC RESONANCE TOMOGRAPHY APPARATUS WITH SHIM COIL ADJUSTMENT DEPENDENT ON POSITIONAL CHANGES OF THE IMAGED REGION

(75) Inventors: Edgar Mueller, Heroldsbach (DE); Stefan Thesen, Meckenheim (DE)

(73) Assignee: Siemens Aktiengesellschaft, Munich (DE)

( * ) Notice: Subject to any disclaimer, the term of this patent is extended or adjusted under 35 U.S.C. 154(b) by 26 days.

(21) Appl. No.: 09/734,978

(22) Filed: Dec. 11, 2000

(65) Prior Publication Data

US 2001/0048306 A1 Dec. 6, 2001

(30) Foreign Application Priority Data

Dec. 10, 1999 (DE) .......................................... 199 59 720

(51) Int. Cl.[7] .................................................. G01V 3/00
(52) U.S. Cl. ........................ 324/307; 324/309; 324/318; 324/320; 324/322
(58) Field of Search ................................ 324/307, 309, 324/318, 320, 321, 322

(56) References Cited

U.S. PATENT DOCUMENTS

| | | | | |
|---|---|---|---|---|
| 4,720,679 A | * | 1/1988 | Patrick et al. | 324/309 |
| 5,121,060 A | * | 6/1992 | Doddrell et al. | 324/318 |
| 5,281,917 A | * | 1/1994 | Santyr | 324/307 |
| 5,285,158 A | * | 2/1994 | Mistretta et al. | 324/306 |
| 5,404,882 A | * | 4/1995 | Santyr | 324/309 |
| 5,614,827 A | | 3/1997 | Heid | |
| 5,828,770 A | | 10/1998 | Leis et al. | |
| 5,923,417 A | | 7/1999 | Leis | |
| 6,144,201 A | * | 11/2000 | Miyazaki | 324/306 |
| 6,294,972 B1 | * | 9/2001 | Jesmanowicz et al. | 324/618 |

OTHER PUBLICATIONS

"Real–Time Prospective Correction of Complex Multiplanar Motion in fMRI", Ward et al, Proc. of ISMRM 7 (1999), p. 270.

"Movement–Related Effects in fMRI Time–Series", Friston et al, Magnetic Resonance in Medicine, vol. 35 (1996), pp. 346–355.

"Spatial Transformation of Images", Human Brain Function, Frackowiak et al, Chapter 3 (1997), pp. 43–58.

"Decoupled Automated Rotational and Translational Registration for Functional MRI Time Series Data: The DART Registration Algorithm", Maas et al, Magnetic Resonance in Medicine, vol. 37 (1997), pp. 131–139.

"Symmetric Phase–Only Matched Filtering of Fourier–Mellin Transforms for Image Registration and Recognition", Chen et al, IEEE Trans. on Pattern Analysis and Machine Intelligence, vol. 16, No. 12, Dec. 1994, pp. 131–139.

* cited by examiner

Primary Examiner—Edward Lefkowitz
Assistant Examiner—Dixomara Vargas
(74) Attorney, Agent, or Firm—Schiff Hardin & Waite

(57) ABSTRACT

In a method for operating a magnetic resonance tomography system having a shim coil arrangement and a gradient coil arrangement, in which, in order to generate an image dataset of a region of an examination subject to be imaged, at least the region that is to be imaged is borne in an imaging volume of the system, an initial shim adjustment procedure is carried out, a change (if it occurs) in the position of the imaged region in relation to the imaging volume is detected, and a current in the shim coil arrangement is modified dependent on the detected position change.

9 Claims, 3 Drawing Sheets

METHOD FOR OPERATING A MAGNETIC RESONANCE TOMOGRAPHY APPARATUS WITH SHIM COIL ADJUSTMENT DEPENDENT ON POSITIONAL CHANGES OF THE IMAGED REGION

BACKGROUND OF THE INVENTION

1. Field of the Invention

The present invention relates to a method for operating a magnetic resonance tomography apparatus of the type having a shim coil arrangement and a gradient coil arrangement, whereby, in order to generate an image dataset of a region of an examination subject, at least the region that must be imaged is borne in an imaging volume of the device, and an initial shim adjustment procedure is carried out.

2. Description of the Prior Art

In magnetic resonance tomography, the homogeneity of the base magnetic field is a decisive factor with respect to the quality of the magnetic resonance images. Field inhomogeneities of the base magnetic field within the imaging volume of a magnetic resonance tomography system cause geometric distortions of the magnetic resonance image that are proportional to the field inhomogeneities. Field homogeneity is particularly important in sequences known as rapid pulse sequences, such as in echo-planar methods.

Measures to improve the base magnetic field homogeneity are referred to as shimming. There are passive and active shim measures. In passive shimming, a number of iron plates are attached in the examination space of the magnetic resonance tomography system in an appropriate arrangement. The base magnetic field in the imaging volume is measured prior to attaching the iron plates. From the measured values, a computer program calculates the appropriate number and arrangement of the iron plates.

In active shimming, correction coils which homogenize the base magnetic field, known as shim coils, are provided in a shim coil arrangement. To operate the shim coil arrangement, a power pack that delivers highly constant and reproducibly adjustable direct currents is needed. The shim coil arrangement is used for fine correction whenever a very high homogeneity is needed, for instance to correct field distortions that are caused by the susceptibility of an examination subject.

As is known from German Patent 195 11 791, corresponding to U.S. Pat. No. 5,614,827, the base magnetic field in the imaging volume can be described by coefficients of spherical harmonic functions. This patent also teaches that linear base magnetic field deviations, i.e. first-order field disturbances, can be compensated by charging gradient coils with an offset current. The offset current is a constant current that is superimposed on a current that executes a gradient sequence. To compensate higher-order field inhomogeneities, respective shim coils are provided in correspondence to the order that must be compensated, each such coil essentially compensates the corresponding field disturbance, for which it must be charged with a suitable current. In magnetic resonance tomography, nine shim coils generally suffice even given high requirements, so that, together with the three gradient coils, twelve spherical coefficients that disturb the field homogeneity most severely can be cancelled.

Due to the field-distorting effect of the examination subject, a shim adjustment procedure is performed in the course of generating magnetic resonance images. In this process, the currents for the individual shim coils and the offset currents for the gradient coils are determined once subsequent to positioning the volume of a region of the examination subject that is to be imaged. The shim adjustment procedure is carried out according to the following steps in accordance with the abovementioned patent:

In a first step, two three-dimensional, spatially resolved magnetic resonance raw datasets are defined in the form of two three-dimensional raw data matrices whose phases have different sensitivities to inhomogeneities of the base magnetic field. The first raw data matrix is obtained using a first series of sequences with a first echo time. The same series of sequences is repeated with a second echo time which is larger than the first echo time. The second raw data matrix is obtained therefrom. In the second raw data matrix, base magnetic field inhomogeneities influence the phase of the measured signals more strongly, since the base magnetic field inhomogeneities have a longer effect longer due to the longer echo time.

In a second step, the two raw data matrices undergo a three-dimensional Fourier transformation.

In a third step, a three-dimensional phase difference matrix is calculated by determining phase differences between corresponding voxels of the two Fourier transformed matrices.

In a fourth step, phase differences between spatially adjacent voxels are calculated in the phase difference matrix PD. This is done for all three spatial directions, with a phase error dataset being produced for each direction, for example.

In a fifth step, the currents for each shim coil and for each gradient coil are computed based on the measured phase error dataset and on a predetermined matrix A. The matrix A characterizes the effect of one unit current on each voxel of the phase error dataset for each shim coil and for each gradient coil. This matrix A must be defined only once for each magnetic resonance tomography system and then remains constant as long as there are no modifications to the system.

In a sixth and final step, the computed shim currents in the shim coil arrangement and the offset currents in the gradient coils are correspondingly adjusted.

The computed shim setting remains unchanged for all magnetic resonance images of the examination subject that must be obtained. Apart from the one-time determination of the matrix A, the first step of the initial shim adjustment process described above is by far the most time consuming. Even when, instead of the first and second series of sequences, only one sequence is used, which delivers two signals with different echo times following a single excitation, and in addition a substantially smaller spatial resolution is selected compared to a diagnostic magnetic resonance image, the time frame for step one is always in the 30-second range.

Subsequent to a position change of the imaged region, for instance as a result of a movement of the examination subject, the shim setting that was calculated in the initial shim adjustment procedure is no longer optimal, and consequently the images that are created in the continued course of the magnetic resonance tomography procedure contain distortions dependent upon the position modification. Such distortions resulting from a change of position of the imaged region can be avoided by undertaking a new shim adjustment procedure as described above. For this purpose, the magnetic resonance data acquisition of the examination subject would have to be interrupted, so the time-consuming shim adjustment procedure can be performed again. This would lead to an unacceptable prolonging of the duration of the magnetic resonance tomography procedure, particularly given repeated position changes, and it is therefore not done in practice.

SUMMARY OF THE INVENTION

It is an object of the present invention to design a method of the abovementioned type with which it is possible to achieve an optimal shim adjustment at any time during a magnetic resonance tomography procedure in a time-efficient manner, even when the imaged region changes its position.

This object is inventively achieved in a method for operating a magnetic resonance tomography apparatus wherein a position change of the imaged region in relation to the imaging volume is detected, and a current in the shim coil arrangement is modified dependent on the detected position change.

For simplifying the description of the advantages of the inventive method, it is assumed, without limiting the method, that the base magnetic field in the imaging volume is sufficiently homogenous without an examination subject therein, and that a region of the examination subject that must be imaged is a head of a patient. Subsequent to positioning the head in the imaging volume of a magnetic resonance tomography device, an initial shim adjustment procedure is carried out as described above. With this procedure, the distorting effect of the head on the homogeneity of the base magnetic field (which is presumed to be sufficiently homogenous) is detected, and the currents in a shim coil arrangement are adjusted so as to counteract the aforementioned distortion. Each change of the position of the head, for instance due to a movement by the patient, leads to a change of the homogeneity characteristics in the imaging volume, so that the initially calculated shim setting is no longer optimal, leading to corresponding image distortions. For this reason, if a change of position of the head occurs, this is inventively detected, and the currents in the shim coil arrangement are adapted according to the detected change of position. In this way, a high image quality is guaranteed for all magnetic resonance images. The adjustment of the shim coil currents is accomplished in a time-efficient manner by means of the distorting effect of the head that was calculated in the initial shim adjustment procedure simply being transferred to a new position or orientation of the head in the imaging volume. A time-consuming sequence such as the above described step one of the conventional initial shim adjustment procedure need not be performed. In the context of the above described method for shim adjustment from U.S. Pat. No. 5,614,827, the phase difference matrix is shifted in accordance with the inventive method, i.e. rotated, in correspondence to the detected translation, i.e. rotation, of the head, and is fed into the remaining shim adjustment procedure at step four as the new phase difference matrix.

The inventive method also can be used in base magnetic fields that are more or less inhomogeneous without an examination subject therein. In addition to the above described inventive method steps, it is then necessary to know the homogeneity distribution of the base magnetic field in the imaging volume without an examination subject present. For example, the distorting effect of the head plus the inhomogeneity of the base magnetic field without an examination subject can be compensated in an initial shim adjustment procedure. Given knowledge of the aforementioned homogeneity distribution and knowledge of the position of the head in the imaging volume, the distorting effect that is caused solely by the head can be computed. Given a change of the position of the head, the shim coil currents are adjusted by transferring the distorting effect to the new position, i.e. orientation, of the head, and the known homogeneity distribution at the new position is additionally taken into consideration.

In an embodiment of the inventive method, an offset current in the gradient coil arrangement is adapted in correspondence to the detected position change. Only by resetting the offset currents in the gradient coils in connection with a resetting of the shim currents does a complete adaptation of the shim setting take place.

In another embodiment the position change is computed from image datasets that are generated successively in time. As a result, additional devices or sequences for detecting position changes are not needed. As described above, position changes of the region that must be imaged lead to image distortions. Therefore, in order to detect position changes reliably, the resulting image distortions in the magnetic resonance image must be sufficiently small in relation to the position changes. This condition is satisfied, particularly in the case of larger position changes, such as rotations of the head by more than 5 degrees. This has the beneficial effect that, for example, given large rotations the rotation is reliably calculated from the image datasets, and in correspondence to the large position change a relatively large distortion effect is compensated.

A group of methods for calculating position change from image datasets that are picked up successively in time is based on describing an arbitrary rigid body movement in three-dimensional space using six movement parameters, three of which characterize translations and three of which characterize rotations. These parameters are entered in a column vector $\vec{q}$. The values of all voxels or select voxels of a first image dataset and a second image dataset that was generated subsequent to the first dataset are entered in a matching order in a first column vector x and a second column vector y. To calculate a position change between the pickup times of the first and second image datasets, i.e. to determine the movement parameters, the following equation, which is based on a first-order Taylor embodiment, is solved, for instance by an iterative method:

$$\vec{y} - \vec{x} = \begin{bmatrix} \frac{\partial x_1}{\partial q_1} & \cdots & \frac{\partial x_1}{\partial q_6} \\ \vdots & \ddots & \vdots \\ \frac{\partial x_n}{\partial q_1} & \cdots & \frac{\partial x_n}{\partial q_6} \end{bmatrix} \cdot \vec{q} \text{ with } \vec{x} = \begin{bmatrix} x_1 \\ \vdots \\ x_n \end{bmatrix};$$

$$\vec{y} = \begin{bmatrix} y_1 \\ \vdots \\ y_n \end{bmatrix}; \vec{q} = \begin{bmatrix} q_1 \\ \vdots \\ q_6 \end{bmatrix}$$

More detailed description of position change detection algorithms of the above group which are based on image datasets, are provided in the book "Human Brain Function", by R. S. J. Frackowiak (Academic Press, 1997, ch. 3, pp. 43–58) and the article "Movement-Related Effects in fMRI Time Series" (K. J. Friston, *Magnetic Resonance in Medicine* 35, 1996: 346–355).

In another group of methods for position change detection based on image datasets, all or selected points of a first image dataset that is described in k space, and of a second image dataset that was generated subsequent to the first dataset are compared to each other. From this comparison, a position change can be computed in a similar manner as with navigator echoes, which will be described below. These methods are described in detail in the article "Decoupled Automated Rotational and Translational Registration for Functional MRI time Series Data: The DART Registration Algorithm" (L. C. Maas; *Magnetic Resonance in Medicine* 37; 1997:131–139) and in the article "Symmetric Phase-Only Matched Filtering of Fourier-Mellin Transforms for Image Registration and Recognition" (Q. Chen, *IEEE Transactions on Pattern Analysis and Machine Intelligence* 16; 12; 1994: 1156–1168).

In a further embodiment the image datasets are two-dimensional datasets. From two-dimensional image datasets that are generated successively in time, it is possible to compute position changes rapidly and easily.

In another embodiment, the image datasets are three-dimensional image datasets. From three-dimensional image datasets that are generated successively in time, it is also possible to compute complex position changes in all three directions in space as well as rotations.

In another embodiment the image datasets are generated by an echo-planar method. In this way, a rapid generation is achieved particularly of large three- dimensional image datasets. Besides echo-planar methods, methods of similar speed such as RARE, HASTE and GRASE can be used.

In a further embodiment, the position change is computed by an orbital navigator echo. An orbital navigator echo is a magnetic resonance signal that is characterized by a circular path in k space and that is generated by a specific navigator sequence. Using orbital navigator echoes that are generated at different times, position changes, i.e. rotations and translations, of a slice can be computed within a plane that is spread by the slice. To this end, before an image dataset of the slice is picked up by means of an imaging sequence, the navigator sequence is executed, and a navigator echo is picked up, which is used as a reference. After a definite period of time, an additional image dataset of the slice is generated, with an additional preliminary navigator echo pick-up. By comparing the two navigator echoes, a position change of the slice that occurs between the two navigator echoes can be detected. Specifically, given a rotation of the slice, the magnitude of the second navigator echo changes relative to the navigator echo serving as the reference, and given a translation in one or both directions of the planes, the phase thereof changes. Arbitrary position changes in three-dimensional space are detected by means of multiple orbital navigator echoes. This is described in the article "Real-Time Prospective Correction of Complex Multiplanar Motion in fMRI" (H. A. Ward, *Proc. Of ISMRM* 7; 1999: 270). It is also possible to detect small position changes using orbital navigator echoes, without having to provide additional devices at the magnetic resonance tomography system for this purpose.

In another embodiment the position change is detected optically. In this way, even the smallest position changes can be reliably detected independently (in terms of time) of the imaging sequences of the magnetic resonance tomography system that must be executed. For example, in a version of this embodiment, optical reflectors are attached at the region that must be imaged, the positions and orientations of which are captured by a stereoscopic camera. The aforementioned detection device together with the associated method for operating the device are described in the U.S. Pat. Nos. 5,828,770 and 5,923,417.

In a further embodiment, the position change is detected at a time interval of from 0.1 to 5 seconds. In this way, a reliable detection of position changes is achieved. In functional magnetic resonance tomography procedure in particular, the time interval is advantageously selected in accordance with the time cycle with which image datasets are generated in the context of the particular functional magnetic resonance tomography procedure.

DESCRIPTION OF THE PREFERRED EMBODIMENTS

Figure 1:
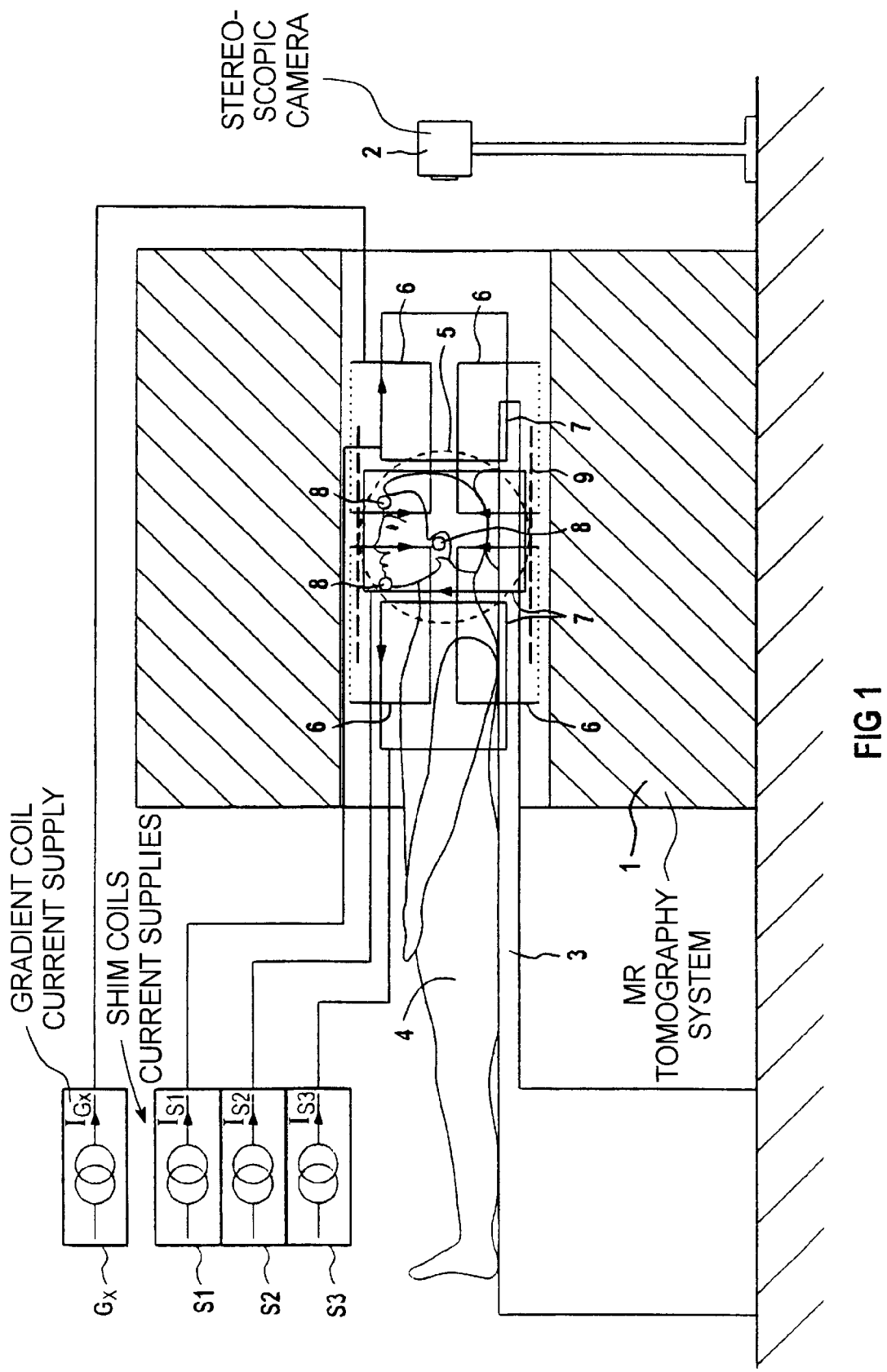
FIG. 1 is a longitudinal section through a magnetic resonance tomography system having a stereoscopic camera for the optical detection of position changes operable in accordance with the inventive method.

FIG. 1 shows an exemplary embodiment of the invention as a longitudinal section through a magnetic resonance tomography system 1 having a stereoscopic camera 2 for optically detecting position changes of an imaged region. The device 1 has a movable support mechanism 3 on which a patient 4 is borne. As the region of the patient 4 that must be imaged, the head is positioned within an imaging volume 5 of the device 1. The device 1 also contains a gradient coil arrangement 6 and a shim coil arrangement 7. From the gradient coil arrangement 6 a transverse gradient coil consisting of four saddle coils is represented as an example. The gradient coil of the arrangement 6 is connected to a controlled current supply device $G_x$, so that a current $I_{Gx}$ in the gradient coils can be controlled. The current $I_{Gx}$ has a portion for executing the gradient sequence and an offset portion for compensating inhomogeneities of the base magnetic field. From the shim coil arrangement 7, three shim coils are represented as an example. Each of the shim coils is connected to a controlled current supply device S1 to S3, so that currents $I_{s1}$ to $I_{s3}$ can be set in the shim coils. The device 1 also contains a high-frequency system, of which only one high-frequency antenna 9 is represented so as to allow a better overview. High-frequency signals which are generated by the high-frequency antenna 9 and which serve for triggering magnetic resonance signals in the head of the patient 4, as well as the gradient fields that are generated by the gradient coil arrangement 6, are set so as to effectuate a location coding of the magnetic resonance signals within the head, among other things.

A number of optical reflectors 8 are attached at the head of the patient 4 in order to detect changes in the position of the head. The spatial position and orientation of the reflectors 8, and thus of the head, is detected by a stereoscopic camera 2. With the detection of position changes of the head, in order to adapt the compensation of inhomogeneities of the base magnetic field, the offset currents in the gradient coil arrangement 6 and the currents in the shim coil arrangement 7 are readjusted (modified) accordingly. Additionally, the portions of the gradient coil currents that execute a gradient sequence, as well as the high-frequency system, also may be readjusted in the adaptation of the location coding to the position change.

In the field of medicine, essentially all methods that use repeated scanning of a structure of organs and tissues to image processes that change over time, such as physiological functions or pathological processes, are classified as functional imaging methods. In the narrow sense, in magnetic resonance tomography the term functional imaging is used to describe measuring methods which make it possible to identify and image areas of the brain that participate in particular motor, sensory or cognitive tasks. In such methods, three-dimensional image datasets of the brain are picked up, for instance every two to four seconds, by an echo-planar method, for example. The advantage of echo-planar methods is that the image dataset pick-up process is very fast, requiring less than 100 ms for an individual image.

Figure 2:
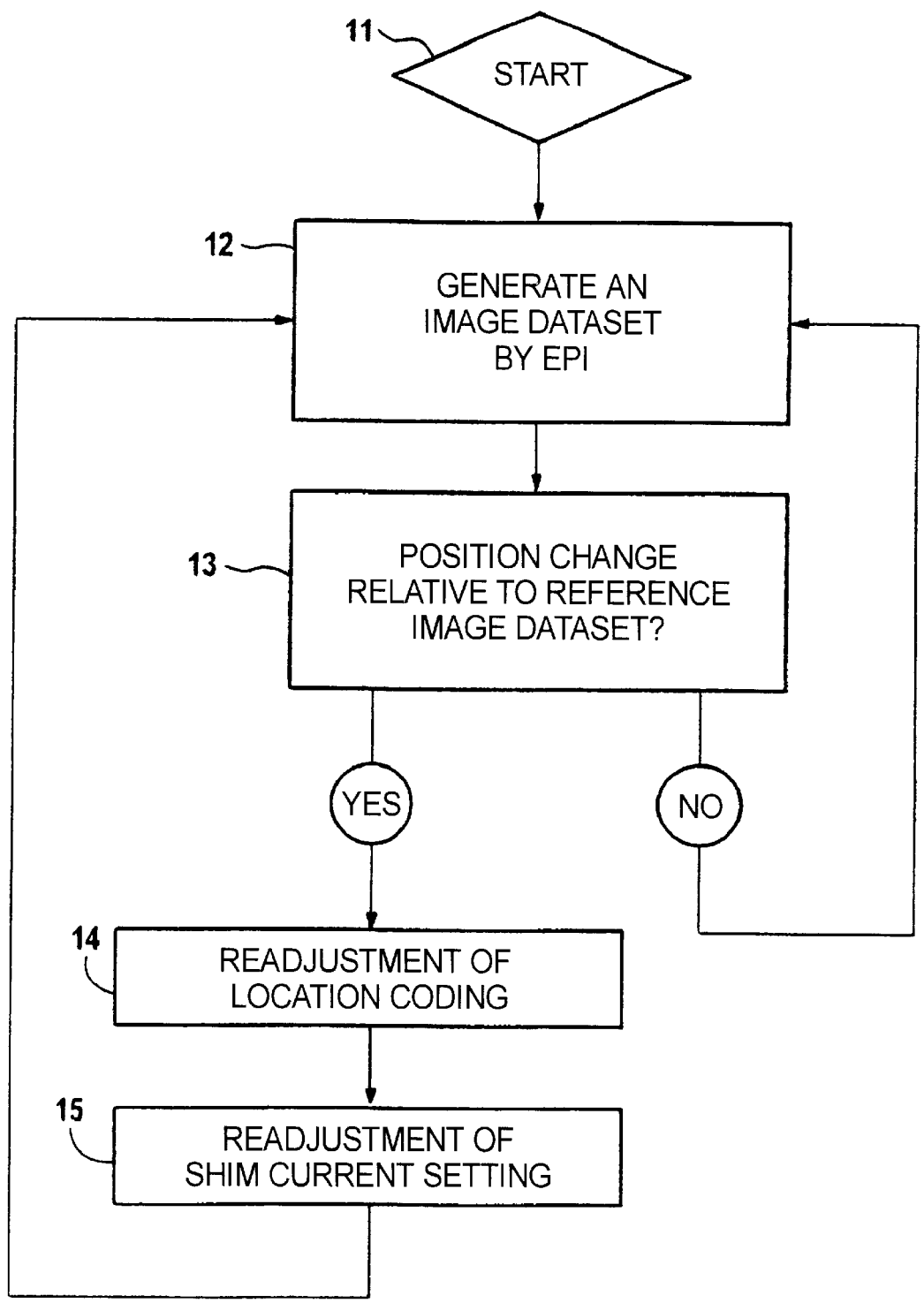
FIG. 2 is a flowchart of a functional magnetic resonance tomography procedure with a detection of position changes from consecutively generated image datasets in accordance with the inventive method.

FIG. 2 shows an exemplary embodiment of the invention as a flowchart for a functional magnetic resonance tomography procedure. In the start step 11 the head of a patient is positioned in the examination volume of a magnetic resonance tomography system as the region that is to be imaged; the initial shim setting step is performed, for instance in accordance with the aforementioned U.S. Pat. No. 5,614,827; and a reference image dataset of the head, for instance a three-dimensional dataset, is picked up, for instance by an echo-planar method EPI. According to an adjustable time cycle of the functional magnetic resonance tomography procedure, in a later step 12 a second image dataset of the head is likewise generated by EPI. In a further step 13 this is compared to the reference image dataset. If a change in the position of the head was not determined, a third image dataset is computed in the scope of step 12 according to the set time cycle. If, however, a change of position of the head is registered, prior to the pick-up of the third image dataset, both the location coding 14 and the shim setting 15 are readjusted accordingly, as characterized by readjustments of the shim coil currents and the offset currents in the gradient coils. Subsequent to the corresponding readjustment, the third image dataset is measured in accordance with the set time cycle. Next, in step 13 the third image dataset is in turn compared to the reference image dataset, and so on, until the end of the functional magnetic resonance tomography procedure.

Figure 3:
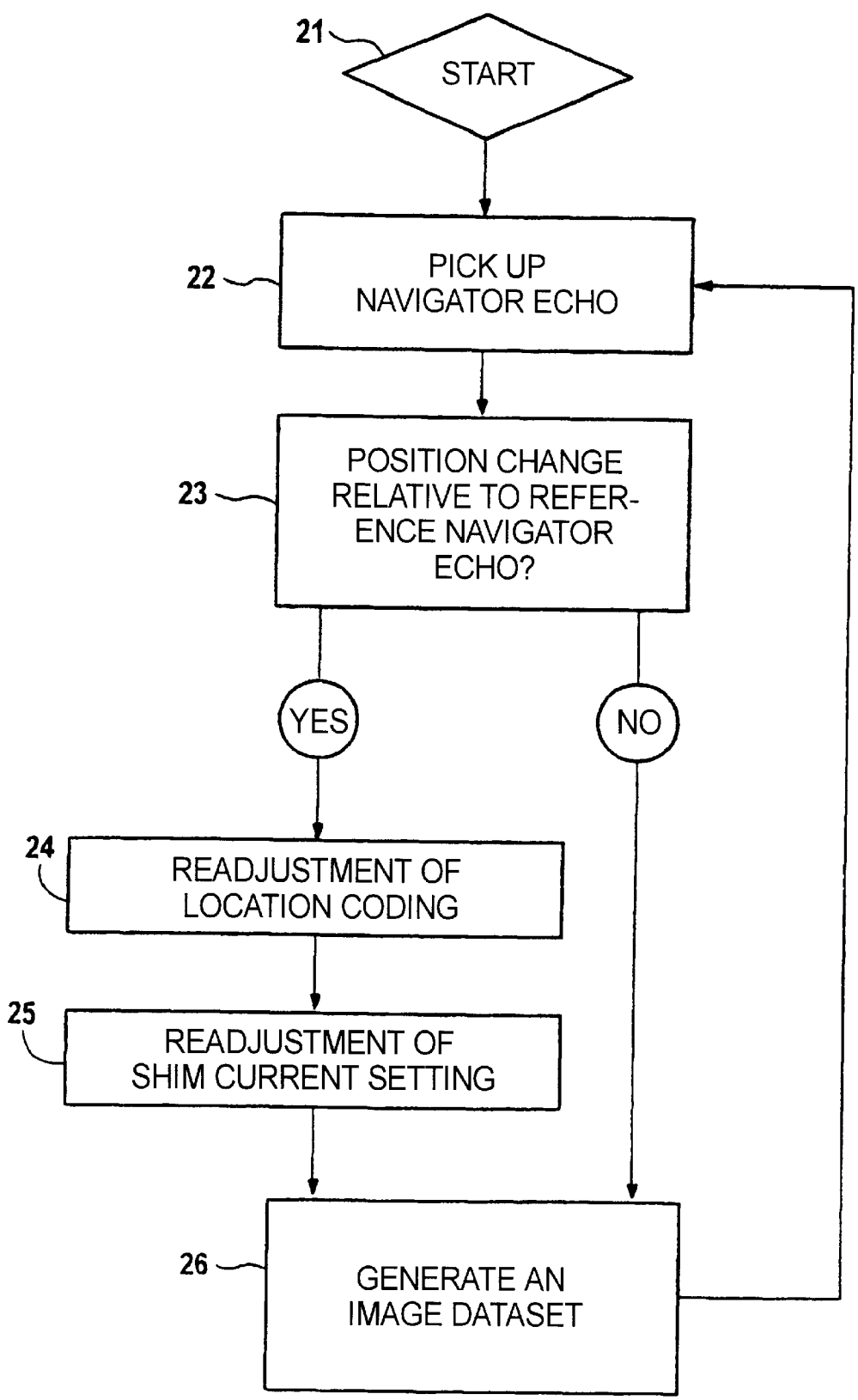
FIG. 3 is a flowchart of a functional magnetic resonance tomography procedure with a detection of position changes by means of orbital navigator echoes in accordance with the inventive method.

FIG. 3 shows an exemplary embodiment of the invention as a flowchart for a functional magnetic resonance tomography procedure with a detecting of position changes by orbital navigator echoes. In start step 21 a region of an examination subject that must be imaged is positioned in the imaging volume of the device; the initial shim setting step is carried out, for instance in accordance with the above cited U.S. Pat. No. 5,614,827; a reference navigator echo is picked up; and a first image dataset of the region that is to be imaged is picked up. In accordance with an adjustable time cycle of the functional magnetic resonance tomography procedure of, for instance, three seconds, a second navigator echo is picked up in step 22. This is compared to the reference navigator echo in a subsequent step 23. If a change in the position of the region that is to be imaged is not determined, then a second image dataset is computed in a subsequent step 26. If, however, a change of position of the head is registered, prior to the pick-up of the second image dataset, both the location coding 24 and the shim setting 25 are readjusted accordingly. Subsequent to the corresponding readjustment, in step 26 the second image dataset is measured. In accordance with the set time cycle of the functional magnetic resonance tomography procedure, a third navigator echo is picked up in step 22, which is also compared to the reference navigator echo in step 23, and so on, until the end of the functional magnetic resonance tomography procedure.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance tomography apparatus comprising the steps of:
    disposing at least a region to be imaged of an examination subject in an imaging volume of a magnetic resonance tomography apparatus;
    performing an examination of said region while producing a static magnetic field in said imaging volume and obtaining at least one image dataset of said region, while performing said examination;
    prior to performing said examination, homogenizing said static magnetic field with a shim coil arrangement having a shim coil current flowing therein; and
    while performing said examination, detecting a change in position of said region relative to said imaging volume and adjusting said shim coil current dependent on said change in position.

2. A method as claimed in claim 1 comprising the additional step of, while performing said examination, generating a gradient field in said imaging volume with a gradient coil arrangement having an offset current flowing therein, and adjusting said offset current dependent on said change in position.

3. A method as claimed in claim 1 comprising obtaining chronologically successive image datasets and computing said position change from said successive image datasets.

4. A method as claimed in claim 3 comprising obtaining two-dimensional image datasets.

5. A method as claimed in claim 3 comprising obtaining three-dimensional image datasets.

6. A method as claimed in claim 3 comprising obtaining said image datasets with an echo-planar method.

7. A method as claimed in claim 1 comprising detecting said change in position with an orbital navigator echo.

8. A method as claimed in claim 1 comprising detecting said change in position optically.

9. A method as claimed in claim 1 comprising detecting said change in position at successive time intervals in a range between 0.1 and 5 seconds.

* * * * *